United States Patent
Schmitt et al.

(10) Patent No.: US 6,188,708 B1
(45) Date of Patent: Feb. 13, 2001

(54) LASER SYSTEM AND AMPLIFYING SYSTEM TO PRODUCE SINGLE-FREQUENCY LASER IRRADIATION

(75) Inventors: Nikolnus Schmitt; Max Koeniger, both of Munich; Peter Unger, Ulm; Klaus Pribil, Immenstand, all of (DE)

(73) Assignee: Contraves Space AG, Zurich (CH)

( * ) Notice: Under 35 U.S.C. 154(b), the term of this patent shall be extended for 0 days.

(21) Appl. No.: 09/308,393

(22) PCT Filed: Nov. 10, 1997

(86) PCT No.: PCT/EP97/06219

§ 371 Date: Sep. 22, 1999

§ 102(e) Date: Sep. 22, 1999

(87) PCT Pub. No.: WO98/22999

PCT Pub. Date: May 28, 1998

(30) Foreign Application Priority Data

Nov. 19, 1997 (DE) ............................... 196 47 677

(51) Int. Cl.[7] ....................................... H01S 5/00
(52) U.S. Cl. .................. 372/43; 372/54; 372/28; 372/101; 372/32
(58) Field of Search ................. 372/43, 26, 50, 372/101, 28, 32

(56) References Cited

U.S. PATENT DOCUMENTS 5,446,750   8/1995   Ohtsuka et al. .
5,530,582 * 6/1996   Clark ..................... 359/333
5,539,571 * 7/1996   Welch et al. ............... 372/43

FOREIGN PATENT DOCUMENTS 04025083   1/1982   (JP) .
05013891   1/1993   (JP) .
05235441   9/1993   (JP) .
06152014   5/1994   (JP) .
07038202   2/1995   (JP) .

OTHER PUBLICATIONS

"60mW 1.5 $\mu$m Single–Frequency Low–Noise Fiber Laser MOPA" G.A. Ball, C.E. Holton, G. Hull–Allen and W.W. Morey—Feb., 994 IEEE, pp. 192–194.

"High repetition rate femtosecond dye amplifier using a laser diode pumped neodymium: YAG laser" B. Zysset, MJ. LaGasse, J.G. Fujimoto, J.D.Kafka—320 Applied Physics Letters, Feb. 1989.

* cited by examiner

Primary Examiner—Leon Scott, Jr.
(74) Attorney, Agent, or Firm—Evenson, McKeown, Edwards & Lenahan, P.L.L.C.

(57) ABSTRACT

In a single-frequency laser and amplifier system, the radiation of a single-frequency, diode-pumped solid-state laser, preferably of a low power microcrystal laser or a monolithic ring-laser consisting of rare-earth-doped or transition-metal-doped crystal or glass materials, is coupled into a semiconductor amplifier chip (preferably GaAlAs, InGaAs or InGaAsP). The material system and the epitaxial structuring of the amplifier chip are selected to adapt it to the emission wavelength of the solid-state laser, so that it amplifies the single-frequency radiation of the solid-state laser and therefore generates an output beam which is intensified with respect to the coupled-in laser radiation.

17 Claims, 7 Drawing Sheets

LASER SYSTEM AND AMPLIFYING SYSTEM TO PRODUCE SINGLE-FREQUENCY LASER IRRADIATION

The invention relates to a single-frequency laser and amplifier system.

Nowadays, single-frequency lasers are required for many laser applications for communication tasks. While, in the communication via glass fibers, particularly laser diodes in the wavelength range of about 1.3 μm or 1.5 μm are customary for achieving a particularly high transmission or a particularly low dispersion in the glass fiber, for open-beam laser communication routes, for example, in space between satellites, lasers are also used at a shorter wavelength, for example, at 1.06 μm. Here, the specific requirements less concern the wavelength of the laser irradiation. The spectral narrow-band characteristic of the laser sources is much more important here, because, for the transmission of very high data rates (typically 650 Mbit/s and more) coherent transmission systems are used here.

Here, typical line width requirements are at <10 kHz or even less and a correspondingly low frequency jitter, which is generally not achieved by means of semiconductor lasers in the constant operation. In contrast, solid-state lasers are used here; specifically, for reasons of efficiency, preferably diode-pumped solid-state lasers. These have a coefficient, which is by approximately two orders lower, for changing the optical resonator length and thus the frequency of the laser irradiation with the temperature. In the case of semiconductor laser diodes, the coefficient amounts, for example, typically to 0.3 nm/° C.; at 830 nm, correspondingly 130 GHz/° C., in contrast to typically 3.5 GHz/° C. in the case of Nd;YAG lasers.

A transmitting laser for such an intersatellite transmission route typically requires an output power of >1W of continuous power while simultaneously meeting the line width specification. Further, the laser must be phase-modulated. However, modulators according to the state of the art operate only up to powers of a few 100 mW so that the transmitting laser power must first remain limited to this value and, after the modulation, must be amplified to the required nominal power.

According to the state of the art, diode-pumped solid-state amplifier arrangements are also used here which are constructed similarly to diode-pumped solid-state lasers but are operated below the lasing threshold. However, these amplifier arrangements require relatively high expenditures and are inefficient.

In the case of simple amplifier arrangements with only one or two passes, amplification factors of typically 1.5–2 are achieved here (W. Seelert et al., *OSA Proc. on Advanced Solid-State Lasers* (Hilton Head, 1991), Vol. 10 (1991) 261) so that, for achieving an output power of 1 W from 100 MW oscillator power from the phase modulator, four or more amplifier stages are required.

In contrast, significantly higher amplifications of up to over 50 dB could be reached only by means of multipath amplifier arrangements (Kane et al., *SPIE*, Vol. 2381, Pages 273; compare FIG. 2). These arrangements require relatively high expenditures and, because of the complicated beam guidance, are subjected to high thermal fluctuations. The energy balance for such amplifier arrangements is also relatively poor (here 9.4 W electric input power+30 mW oscillator power resulted in 835 mW output power, electrical to optical amplifier efficiency of less than 9% W). In addition, these arrangements can also not be significantly miniaturized.

Semiconductor laser amplifiers are particularly simple which have a construction similar to that of semiconductor laser diodes of an epitaxial layer sequence of, for example, GaAs, GaAlAs, InGaAs or InGaAsP. In contrast to laser diodes, such semiconductor amplifiers have antireflex coatings on both end surfaces, so that the semiconductor element is operated far below the threshold power required for a laser operation as an oscillator. If laser irradiation is now coupled in on one side of the semiconductor element, this laser irradiation is amplified in the electrically pumped semiconductor material. Such arrangements have also been known for many years and are described, for example, in R. Waarts et al., *Electron. Lett.* 26 (1990) 1926. For generating an irradiation of a high beaming quality, special structurings of the semiconductor amplifier are customary, such as broad-strip or trapezoid structures; compare J. N. Walpole et al., *SPIE*, Vol. 1850, "Laser Diode Technology and Applications V (1993) 51.

Normally, semiconductor laser diodes of the same material are as a laser oscillator whose irradiation is to be amplified. Such oscillator amplifier structures (MOPA—Master Oscillator Power Amplifier) are preferably constructed on the same epitaxial substrate and are separated in their function by a corresponding structuring. Such components are described, for example, in R. Parke, CLEO 93, *Tech.Digest*, Contribution CTuI4 (1993) 108, and are offered commercially. However, these elements do not meet the specifications concerning line width and frequency jitter.

These MOPA structures are unsuitable for the above-mentioned tasks of coherent communication. The spatial beaming quality as well as particularly also the high line widths do not permit a coherent phase locking.

It is an object of the invention to indicate a simple, efficient and miniaturized laser and amplifier system which permits the generating of narrow-band laser irradiation in the watt range.

This object is achieved by the measures indicated in the claims and in the figures.

It is suggested to amplify the irradiation of a low-power diode-pumped solid-state laser (such as an Nd:YAG), preferably of a narrow-band, continuously emitting solid-state laser, such as a microcrystal laser (or a monolithic ring laser), by means of a semiconductor amplifier.

Microcrystal lasers, which, because of their low resonator length, emit in an inherently single-frequency manner, represent particularly simple single-frequency diode-pumped solid-state lasers (compare, for example, Demtröder, "Laser Spectroscopy", Springer Publishers 1982, Page 286, or N. Schmitt, "Tunable Microcrystal Lasers", Shaker Publishers, 1995). The output power of such lasers is typically at 30–50 mW. However, the line widths are particularly narrow here.

Figure 3:
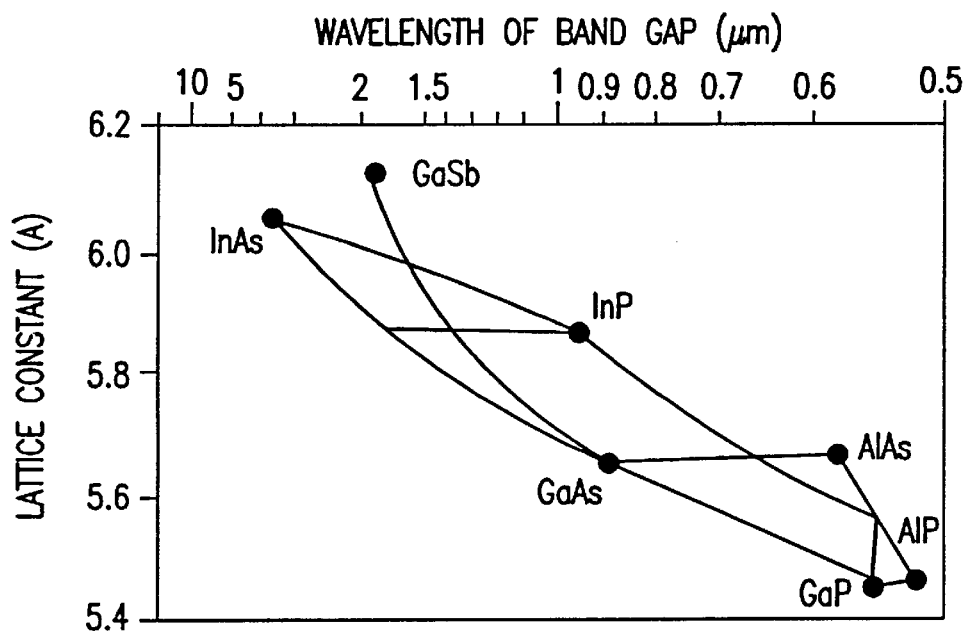
FIG. 3 is a schematic view for the assignment of the suitable semiconductor materials to the respective wavelength range of diode-pumped solid-state lasers.

The idea of the invention is based on the amplification of the laser irradiation of a narrow-band, diode-pumped solid-state laser, for example, a microcrystal laser, preferably consisting of rare-earth-doped or transition-metal-doped crystal materials or glass materials, by means of a semiconductor amplifier element which, by means of the selection of the epitaxy material as well as its structuring, is adapted to the emission wavelength of the solid-state laser. Thus, particularly material combinations of GaAlAs, GaAlAs, InGaAs and/or GaAsP are suitable, for example, for solid-state lasers which emit in the range of between 900 and 1,100 nm. FIG. 3 illustrates which material system is particularly suitable for which wavelength range. The (thick) connecting lines between the III–V material combinations (binary combinations of the elements of Group III and V of the Periodic System) here indicate the so-called tertiary combinations (thus combinations of two elements of Group III and one element of Group V; example: InAs+GaAs=>InGaAs); the dots characterize the binary combinations; along the line, the wavelength and the lattice constant of the tertiary combination change corresponding to the respective percentage of the two binary combinations. The areas between these lines characterize the quaternary combinations (thus, two elements of Group III plus two combinations of Group V; example: InGaAsP). The horizontal lines characterize the combinations with the same lattice constant; in the case of the non-horizontal lines, the lattices of the composition are braced (strained layer). The thin connecting lines, for example, between GaP and AlP and AlP and AlAs characterize indirect semiconductor transitions. Thus, for the amplification of laser radiation, for example, in the wavelength range of 750–900 nm, preferably GaAlAs or InGaAsP structures are used; above 900 nm to approximately 1,120 nm, InAsP, InGaAs or InGaAsP materials are used. GaAsP is also particularly suitable for the amplification in the wavelength range about 630 nm. The selection of the semiconductor amplifier materials depends on the concrete wavelength range of the laser irradiation to be generated. In this case, the material combinations of the ternary compositions (thus, along the lines) are of interest here, as well as quaternary combinations (thus, in the intermediate area between the lines).

Figure 4:
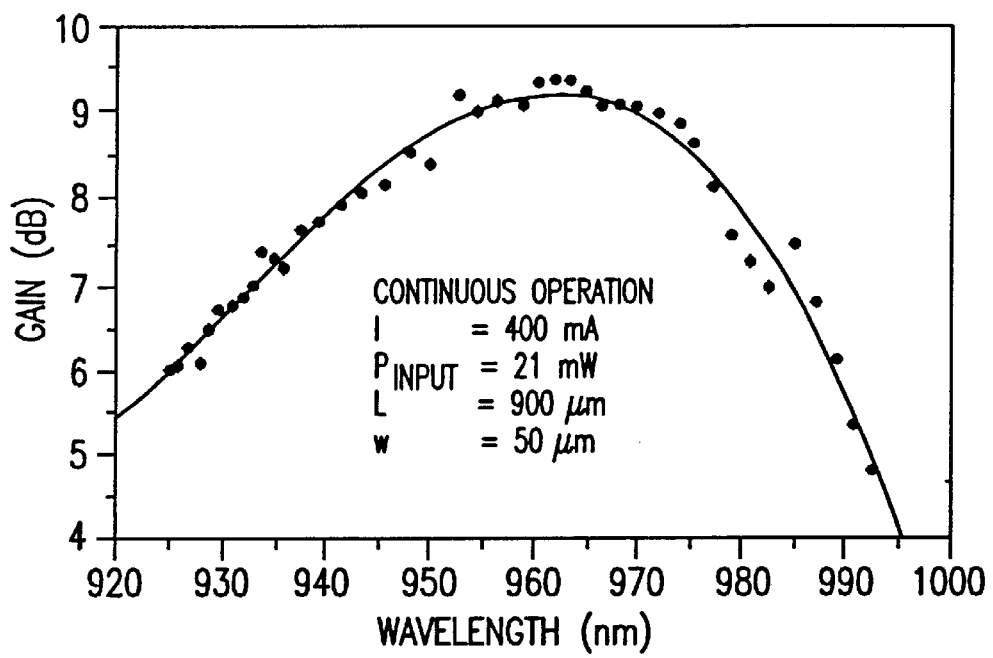
FIG. 4 is a view of a typical amplification profile of an InGaAs semiconductor amplifier according to the prior art, here, with an amplification concentration at about 960 nm (taken from Ebeling/Unger, *Abstract to the2nd Intermediate ReDort F+E Supply Number 13 N 6374/3*, University of Ulm)
Figure 5:
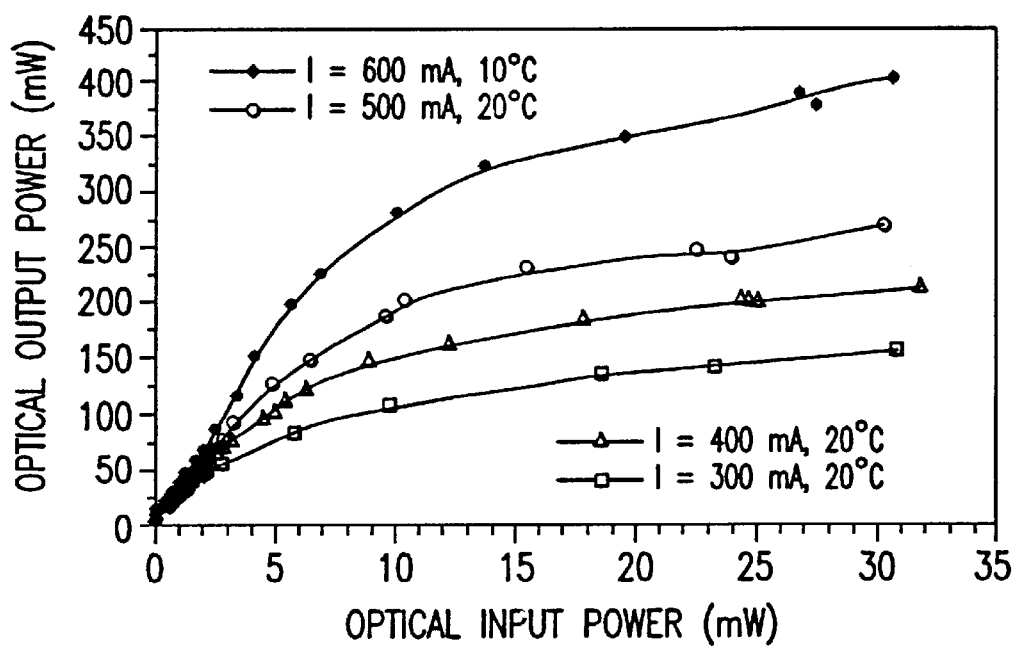
FIG. 5 is a view of a typical amplification curve of a semiconductor amplifier according to the prior art (ibid.)
Figure 6:
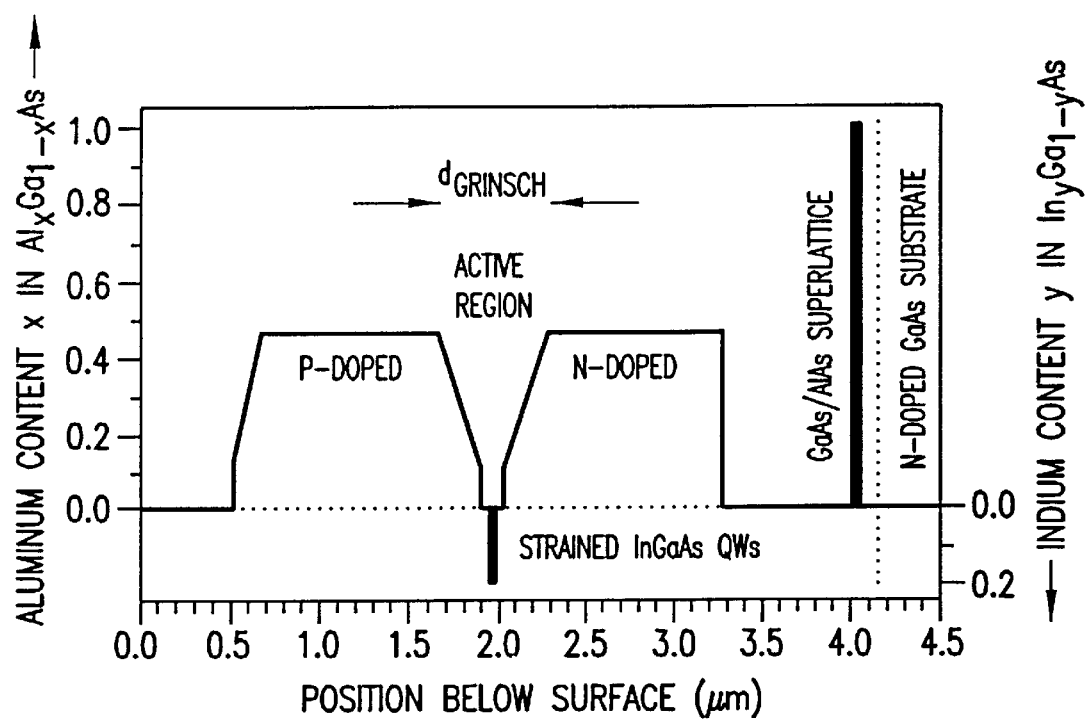
FIG. 6 is a view of a typical layer sequence of an InGaAs amplifier structure.
Figure 7:
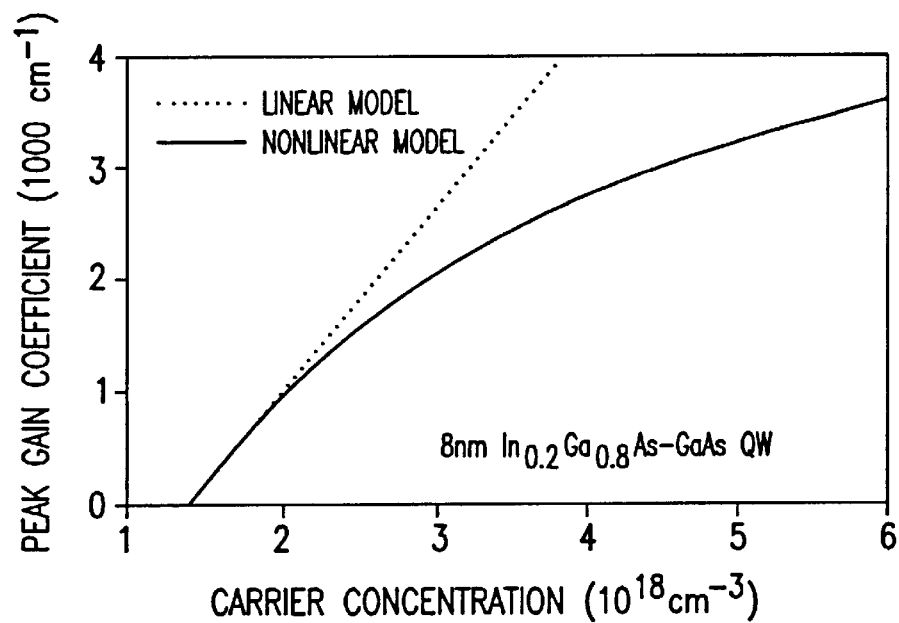
FIG. 7 is a view of the relationship of the spectral amplification concentration and the carrier concentration for the structure from FIG. 6 (ibid.)

The amplification curve of such semiconductor amplifiers is typically 50–60 nm wide (FIG. 4, taken from Ebeling/Unger, Abstract to the 2nd Intermediate Report F+E Supply Number 13 N 6374/3, University of Ulm); its concentration can be correspondingly adjusted by the selection of the thickness of the epitaxy layer (width of the quantized film QW) and doping of the materials. FIG. 5 (ibid.) shows a typical layer sequence for an InGaAs amplifier. By means of the width of the quantized film QW, an influence is exercised particularly also on the carrier concentration which influences the amplification concentration (FIG. 6, ibid.). The amplification of such semiconductor structures, which are preferably pumped electrically by means of charge carrier injection, is generally particularly efficient and typically amounts to 50%; the required saturation intensity for generating laser irradiation in the watt range is typically 5–10 mW (FIG. 7, ibid.).

Figure 1:
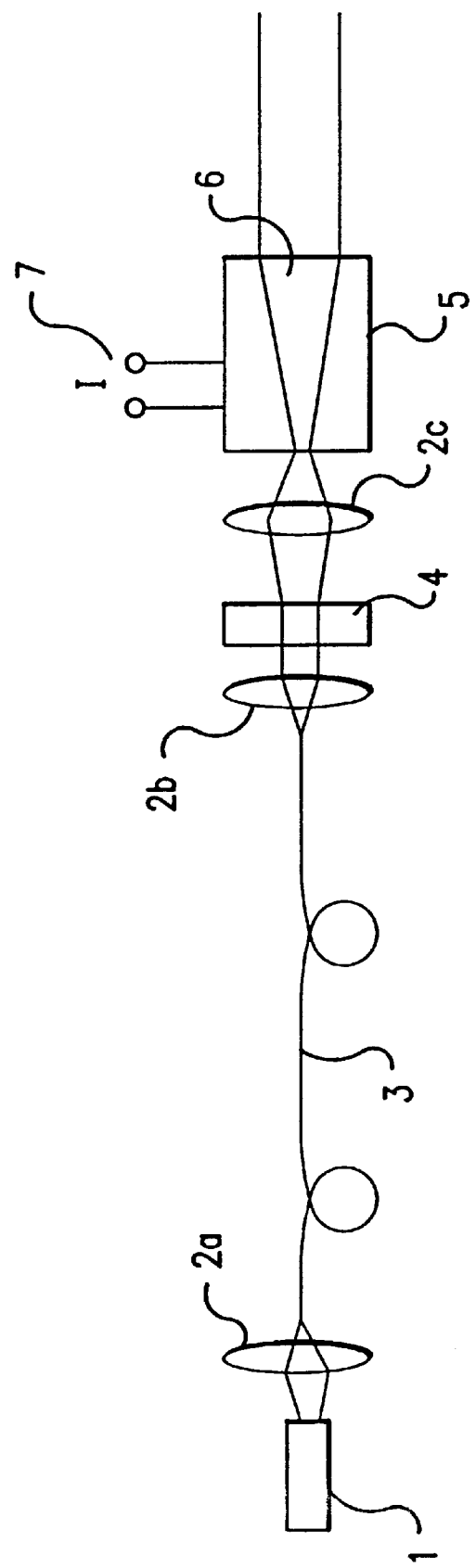
FIG. 1 is a basic diagram of an arrangement according to the invention of a diode-pumped single-frequency solid-state laser—here: microcrystal laser—and a semiconductor amplifier.
Figure 2:
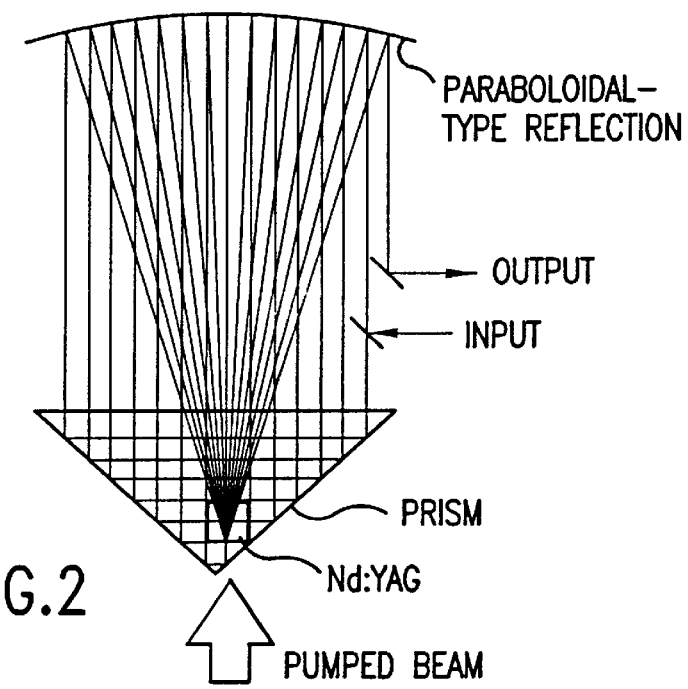
FIG. 2 is a view of a multipath solid-state amplifier according to the prior art with an amplification of 52 dB (from Kane, et al., *SPIE*, Vol. 2381, Pages 273, and on)

FIG. 1 shows such an embodiment of a diode-pumped solid-state laser consisting of a pumping laser diode (1) (whose irradiation may optionally be transmitted by way of aa fiber-optical waveguide (3)) and solid-state laser material (4)-in this example, constructed as a microcrystal which is monolithically vapor-deposited with the required reflecting layers -whose irradiation is coupled into a semiconductor amplifier unit (5). The optical elements (lenses) 2a–c used for the respective coupling are also illustrated. The shown fiber-optical waveguide for the transmission of the pumped light to the microcrystal laser as well as all lenses are optional here and may be omitted.

The semiconductor amplifier (5) is preferably pumped electrically by way of a corresponding feed (7) by the injection of charge carriers into the pn-boundary layer. The spatial structure (6) of the amplifier can preferably be either parallelepiped-shaped (wide strip) or, as illustrated as an example in the figure, trapezoidal; the latter with the advantage of a better beaming quality at the amplifier output. for the focussing, lenses or other elements with lens-like characteristics (holograms, rod-type lenses, etc.) can be used here. Preferably, miniaturized diode-pumped solid-state lasers, such as microcrystal lasers, monolithic ring lasers or generally longitudinally pumped lasers can be used as the solid-state lasers. Since the semiconductor element is operated only as an amplifier and therefore not in resonance, the narrow-band characteristic of the laser line of the first order is maintained. Thus, as the result of the combination of the good lasering characteristics of solid-state lasers and the high and efficient amplification of electrically pumped semiconductor elements, a miniaturized efficient laser system is created which generates output power in the watt range with a particularly small laser line width.

The microcrystal laser as the oscillator represents a particularly preferred embodiment according to the invention since, in addition to having excellent lasering characteristics, as required specifically for the external frequency doubling (narrow line width up to 40 Hz, excellent beam profile $M^2$ typically <1.2; compare Schmitt), it is particularly also already highly miniaturized. Typical dimensions of the entire microcrystal laser (without pumping diode and coupling lens system), which consists, for example, of a monolithically vapor-deposited crystal piece, amount to a diameter of 2–3 mm and typically to a thickness of 200–700 μm; the diameter can be further reduced to 1 mm. Thus, the microcrystal laser is in the order of the semiconductor amplifier structures (typically, several 100 µm in two lateral dimensions and 50–100 µm in its thickness) and can easily be accommodated together with it in a common housing, which is advantageous for the reduction of manufacturing costs and for the miniaturization of the laser system. The pumping laser diode (which typically also measures several 100 µm in every dimension as well as 50–100 µm in its thickness) as well as the coupling lens systems can either also be accommodated in the housing or the pumping laser diode, coupled by way of a fiber-optical waveguide, is arranged in a separate and . . . (something missing in the German—translator) housing, the latter improving the exchangeability. The microcrystal laser as well as the coupling lens systems may be laterally metallized and therefore, like the semiconductor amplifier as well as optionally the pumping laser diode, may be soldered into a hybrid housing.

Figure 8A:
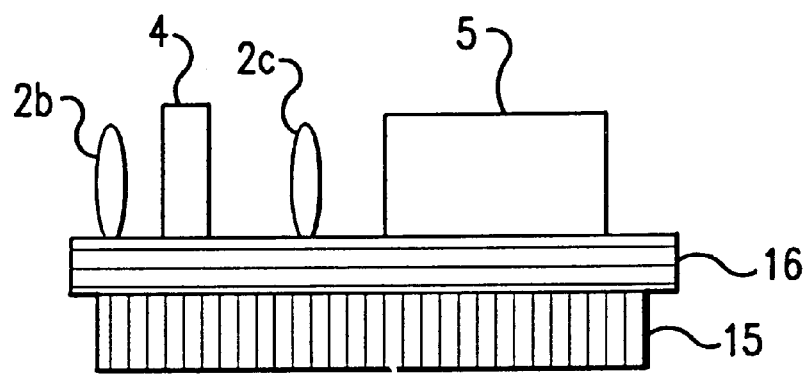
FIG. 8a is a view of an arrangement according to the invention of the solid-state laser and the semiconductor amplifier on the same heat sink.

In a special embodiment, the microcrystal laser (4) and the semiconductor amplifier (5) may be mounted, for example, on the same heat sink (16) (FIG. 8a), which are then jointly tempered by a tempering element (16) which permits a significant increase of the mechanical stability.

Instead of the microcrystal laser, whose operational principle consists of the fact that the resonator of the length L is sufficiently short so that only a single longitudinal resonator mode is in the amplification range δv of the laser material—written as $L \leq c/(n \cdot \delta v)$ (n being the refractive index of the resonator-internal medium; compare N. Schmitt, "Tunable Solid-State Lasers"), in principle, other miniaturized frequency-stable single-frequency lasers can also be used. These may, for example, be diode-pumped lasers with highly-doped materials which are mounted in the proximity of the one reflector, and the spatial "hole burning" is therefore avoided (compare G. J. Kintz et al., *IEEE J. Ouant.Electron.* 26 (1990) 1457). In addition, these may be monolithic ring lasers, as described, for example, in T. J. Kane, *Opt. Lett.* 10 (1985) 65.

Figure 8B:
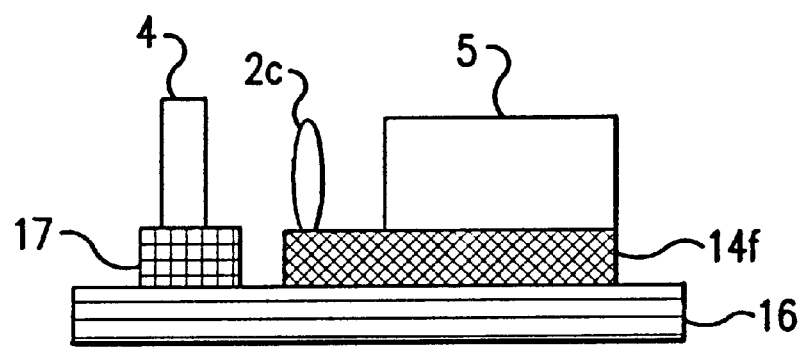
FIG. 8b is a view of an arrangement according to the invention of the tunable solid-state laser and semiconductor amplifier on thermally separate heat sinks or temperature levels while using a Peltier element as an example.
Figure 8C:
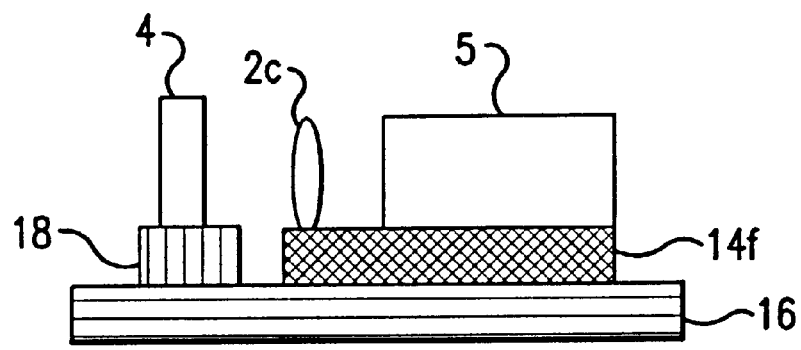
FIG. 8c is a view of an arrangement according to the invention of the tunable solid-state laser and semiconductor amplifier on thermally separate heat sinks and temperature levels while using a thermally poorly conducting material as an example.

For the applications of coherent communication, for example, between satellites, it is, as a rule, required to tune the laser over several 10 GHz in a single-frequency manner in order to compensate the Doppler shift between the satellites moving against one another. Here, tunable microcrystal lasers are very advantageous, since single-frequency tuning ranges of over 130 GHz can be reached (compare N. Schmitt, "Tunable Microcrystal Lasers, Page 143). The tuning can take place either thermally, in which case the temperature of the microcrystal is changed correspondingly, or by means of a movable reflector element of the laser. In the case of the thermal tuning, it is recommended that the microcrystal, which is provided with a heating and/or cooling element, depending on the arrangement of the heating/ cooling element, be mounted on a heat sink, separate from the semiconductor amplifier, or at a different temperature level (outlined, for example, in FIG. 8b and 8c by using a thermally poorly conducting material (17) or of a Peltier element (18)). A common base must then be provided which permits a fixing of the microcrystal with respect to the semiconductor chip.

Figure 9:
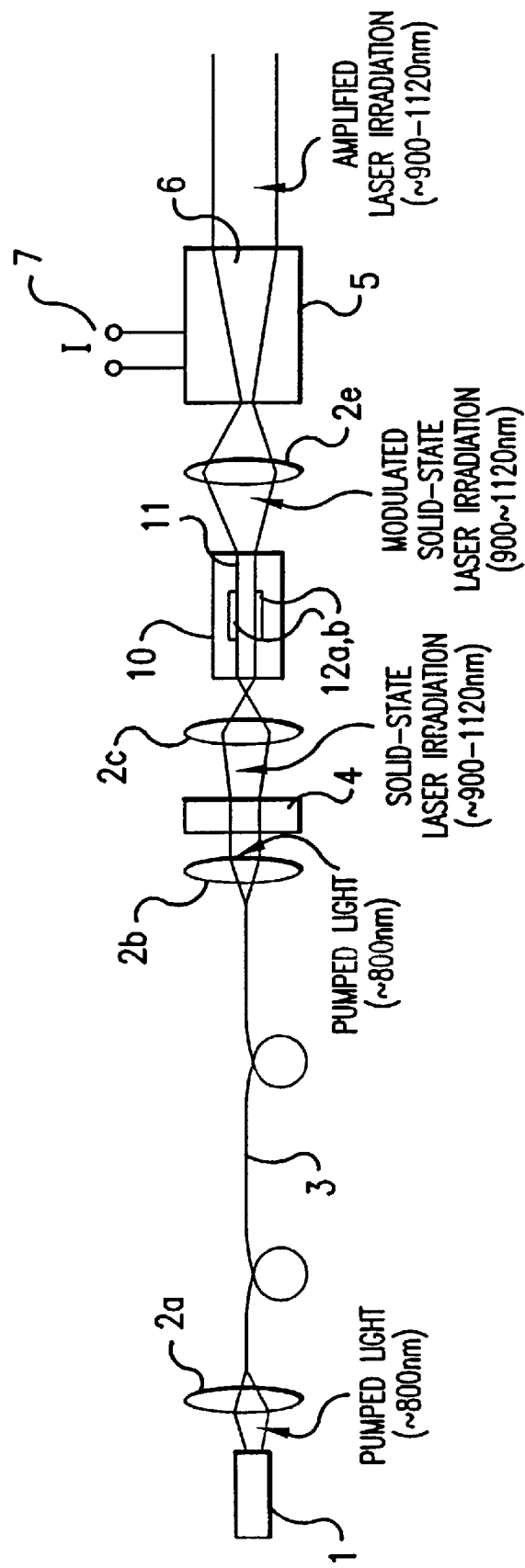
FIG. 9 is a view of an arrangement according to the invention of the solid-state laser and the semiconductor amplifier with the modulator inserted between the two elements.

For the coherent communication, it is required that the laser signal be modulated in its frequency, amplitude or, particularly, its phase. Conventional modulators currently do not allow the modulating of laser powers in the watt range. Here, the suggested concept allows the arranging of the modulator between the solid-state laser and the semiconductor amplifier, which represents an additional important advantage. This is illustrated in FIG. 9. For reducing its size, the modulator (10) preferably is an integrated optical modulator constructed, for example, as a waveguide (11) provided with electrodes (12a.b) in LiNbO$_3$, or a fiber modulator.

Figure 10:
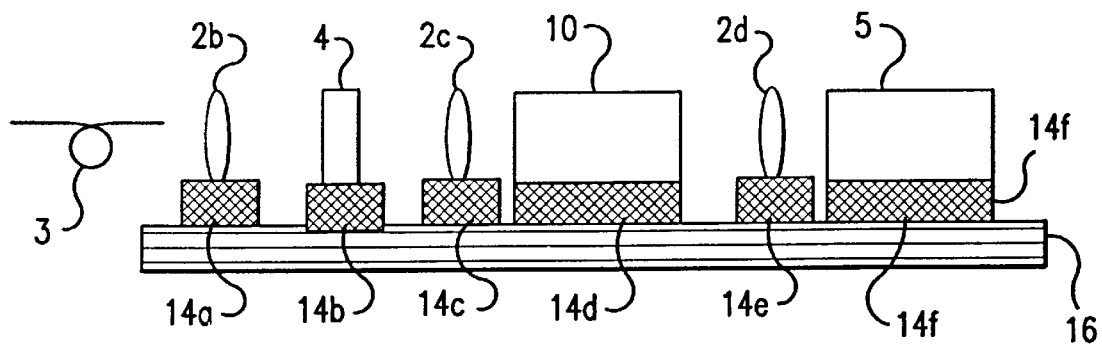
FIG. 10 is a view of an arrangement according to the invention of the solid-state laser, the modular and the semiconductor amplifier on the same base plate.

In this case, it is advantageous to mount the solid-state laser (4), the modulator (10) and the semiconductor amplifier (5) on a single base plate (13) in order to avoid a maladjustment (FIG. 10). In this case, the individual elements may be disposed on mounting bases, tempering elements and/or solder layers (14a . . . ) (or combinations thereof), which optionally also carry out the level adaptation required for a linear optical coupling.

Figure 11:
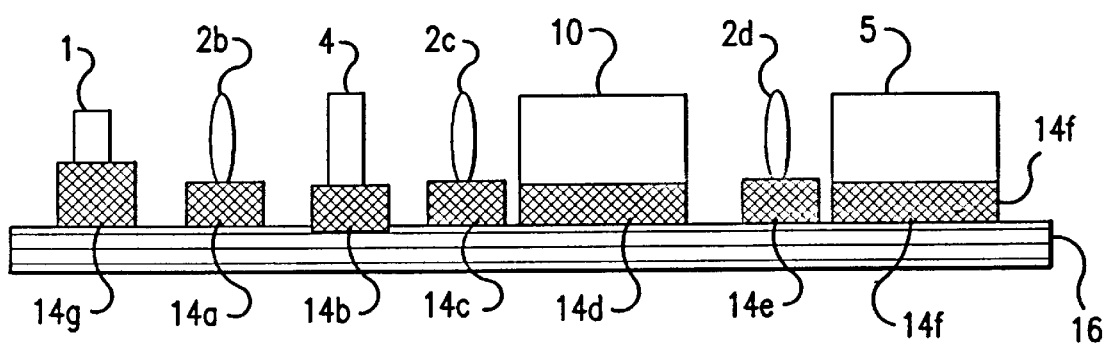
FIG. 11 is a view of an arrangement according to the invention of the pumping laser diode, the solid-state laser, optionally the modulator and semiconductor amplifier and optionally required lenses on the same base plate.

An especially miniaturized, mechanically stable solution which can be manufactured at reasonable cost is obtained in that the laser diode (1), the (microcrystal) laser (4), optionally the modulator (10) and the semiconductor amplifier (5) are mounted on a common base (13) (mounting plate) (FIG. 11).

Instead of using an external modulator (10), at least for some types of modulation, the current for pumping the semiconductor amplifier or the pumping diode can also be modulated.

In summary, a system is introduced which
 by using a diode-pumped solid-state laser, allows the generating of a very narrow-band laser irradiation
 by means of using a semiconductor amplifier in the watt range; and further,
 by using the semiconductor amplifier (and preferably a microcrystal laser) is extremely efficient and miniaturized, and
 by using a modulator between the solid-state laser and the semiconductor laser, permits an amplitude, phase and/ or frequency modulation.

What is claimed is:

1. A single-frequency laser and amplifier system, comprising:
 a low power single-frequency, diode-pumped solid-state laser; and
 a semiconductor amplifier chip coupled to receive radiation from said solid state laser; wherein
 the semiconductor amplifier chip is adapted to air emission wavelength of the solid-state laser by selection of a material system as well as of an epitaxial structuring; and
 the semiconductor amplifier chip amplifies the single- frequency radiation of the solid-state laser and generates an output beam which is amplified relative to the coupled-in laser radiation.

2. The single-frequency laser and amplifier system according to claim 1, wherein the solid-state laser is one of a microcrystal laser and a monolithic ring-laser, made of a material selected from the group.

3. The single-frequency laser and amplifier system according to claim 2, wherein the semiconductor amplifier chip is made of a material selected from the group consisting of GaAs, GaAlAs, InGaAs and InGaAsP.

4. The single-frequency laser and amplifier system according to claim 1, wherein the semiconductor amplifier is electrically pumped.

5. The single-frequency laser and amplifier system according to claim 4, wherein the semiconductor amplifier is electrically pumped.

6. The single-frequency laser and amplifier system according to claim 1, wherein the semiconductor amplifier has a parallelepiped-shaped reinforcing structure.

7. The single-frequency laser and amplifier system according to claim 1, wherein the semiconductor amplifier has a trapezoidal reinforcing structure.

8. The single-frequency laser and amplifier system according to claim 1, further comprising a modulator connected between the solid-state amplifier and the semiconductor laser, for modulating one of phase, frequency and amplitude of the solid-state laser radiation.

9. The single-frequency laser and amplifier system according to claim 1, further comprising focussing elements for coupling the laser beam into at least one of the modulators and the semiconductor chip.

10. The single-frequency laser and amplifier system according to claim 9, wherein said focussing elements are lenses.

11. The single-frequency laser and amplifier system according to claim 1, wherein one of phase, frequency and amplitude modulation of the solid-state laser system is generated by current modulation of a pumping diode of the solid-state laser.

12. The single-frequency laser and amplifier system according to claim 1, modulation of the amplified laser radiation is generated by current modulation of the semiconductor amplifier.

13. The single-frequency laser and amplifier system according to claim 1, wherein the solid-state laser is fixedly mounted with the semiconductor amplifier.

14. The single-frequency laser and amplifier system according to claim 1, wherein the solid-state laser and the semiconductor amplifier are mounted on the same heat sink.

15. The single-frequency laser and amplifier system according to claim 1, wherein:

the solid-state laser is mounted on a heat sink separated from the semiconductor amplifier; and a heating and/or cooling element is mounted on the solid-state laser and the heat sink, which heating and/or cooling element permits a thermally induced frequency tuning of the solid-state laser radiation.

16. The single-frequency laser and amplifier system according to claim 1, wherein components of the system are arranged on a common base, whereby mechanical holders, tempering elements and/or solder layers can be arranged between the individual elements and the base.

17. The single-frequency laser and amplifier system according to claim 1, further comprising:

a modulator connected between the solid-state laser and the semiconductor amplifier; and lenses for the coupling laser radiation; wherein the pumping laser diode and the coupling lenses are arranged on a common base, with at least one of mechanical holders, tempering elements and solder layers arranged between individual elements and the base.

* * * * *

UNITED STATES PATENT AND TRADEMARK OFFICE
CERTIFICATE OF CORRECTION

PATENT NO. : 6,188,708 B1
DATED : February 13, 2001
INVENTOR(S) : Nikolaus Schmitt; Max Koeniger; Peter Unger and Klaus Phibin It is certified that error appears in the above-identified patent and that said Letters Patent is hereby corrected as shown below:

<u>Title page,</u>
Item (75), Please change the first inventor's first name from "Nikolnus" to -- Nikolaus --;
Please change the fourth inventor's city name from "Immenstand" to -- Immenstaad". --

Signed and Sealed this

Twenty-fifth Day of September, 2001

Attest:

*Nicholas P. Godici*

NICHOLAS P. GODICI
*Acting Director of the United States Patent and Trademark Office*

*Attesting Officer*

UNITED STATES PATENT AND TRADEMARK OFFICE
CERTIFICATE OF CORRECTION

PATENT NO. : 6,188,708 B1
DATED : February 13, 2001
INVENTOR(S) : Nikolaus Schmitt, Max Koeniger, Peter Unger and Klaus Pribil It is certified that error appears in the above-identified patent and that said Letters Patent is hereby corrected as shown below:

<u>Title page,</u>
Item [75], Inventors, please change the fourth inventor's last name from "Phibil" to -- Pribil --;

Signed and Sealed this

Twenty-seventh Day of August, 2002

Attest:

Attesting Officer

JAMES E. ROGAN
*Director of the United States Patent and Trademark Office*